United States Patent [19]
Imura

[11] Patent Number: 6,158,028
[45] Date of Patent: Dec. 5, 2000

[54] SEMICONDUCTOR INTEGRATED CIRCUIT

[75] Inventor: Satoru Imura, Tokyo, Japan

[73] Assignee: NEC Corporation, Tokyo, Japan

[21] Appl. No.: 09/128,781

[22] Filed: Aug. 4, 1998

[30] Foreign Application Priority Data

Aug. 6, 1997 [JP] Japan ................................ 9-212057

[51] Int. Cl.⁷ .......................... G11C 29/00; G01R 31/28
[52] U.S. Cl. .......................... 714/718; 714/733; 365/201
[58] Field of Search .................................. 714/718, 719,
714/720, 733, 738, 739, 742, 743, 744;
365/201

[56] References Cited

U.S. PATENT DOCUMENTS

| | | | |
|---|---|---|---|
| 4,442,519 | 4/1984 | Jones et al. ............................. | 714/738 |
| 4,663,728 | 5/1987 | Weatherford et al. .................. | 364/900 |
| 5,222,067 | 6/1993 | Hiroshi .................................... | 714/718 |
| 5,351,213 | 9/1994 | Nakashima ............................. | 365/201 |
| 5,673,270 | 9/1997 | Tsujimoto ............................... | 714/718 |
| 5,729,555 | 3/1998 | Ichikawa ................................. | 714/738 |
| 5,856,985 | 1/1999 | Fujisaki .................................. | 714/738 |

FOREIGN PATENT DOCUMENTS

| | | |
|---|---|---|
| H1-276500 | 11/1989 | Japan . |
| H4-205879 | 7/1992 | Japan . |
| H5-41098 | 2/1993 | Japan . |
| H7-182898 | 7/1995 | Japan . |
| H8-329700 | 12/1996 | Japan . |
| H9-7399 | 1/1997 | Japan . |
| H10-40691 | 2/1998 | Japan . |

Primary Examiner—Emmanuel L. Moise
Attorney, Agent, or Firm—Sughrue, Mion, Zinn, Macpeak & Seas, PLLC

[57] ABSTRACT

At a test of built-in memory of a conventional semiconductor integrated circuit, data is written into the memory one address by one address and confirmed the data one by one, in case of mass memory many test patterns and many test time are required. The present invention comprises a memory which is capable of data writing and reading. Also including is a device for setting the memory in the test state, a device for setting a predetermined length of arbitrary data written into the memory, and a device for writing in a batch process into the memory in a form of filling the memory area of the memory with the arbitrary data.

20 Claims, 8 Drawing Sheets

SEMICONDUCTOR INTEGRATED CIRCUIT

BACKGROUND OF THE INVENTION

The present invention relates to a semiconductor integrated circuit (hereinafter referred to as IC) having a function which tests the built-in memory, in particular it is possible to reduce the test time of the built-in memory.

DESCRIPTION OF THE RELATED ART

FIG. 1 is a rough diagram showing a testing method of the built-in memory in the conventional IC. In the diagram, 51 is a built-in memory, 52 is an input terminal, 53 is a CPU, 54 is an address decoder decoding an address information indicated by a CPU and designating an address for a built-in memory 51 and 55 is an output terminal.

Next, a testing operation for the memory 51 is explained. At first, a data writing to each address of the memory 51 is implemented. Arbitrary data to be written into each address of the memory 51 are inputted to the input terminal 52 from an external testing equipment (tester), the data inputted to the input terminal 52 is written into each address of the memory 51 indicated by the address decoder 54 via the CPU 53 one address by one address, with this operation, the arbitrary data setting to each address of the memory 51 is completed.

After this, a data reading of the stored data in each address of the memory 51 is implemented. The data in the memory 51 are read from the addresses in the memory 51 indicated by the address decoder 54 one address by one address, are outputted from the output terminal 55 through the CPU 53 and these data are compared and examined with the written data (expected data) at the above mentioned external tester. As described above, the data writing, data storing and data reading to the memory 51 have been tested whether the operation is implemented in normal or not, in the conventional IC.

At the above mentioned testing method of the memory 51, in case of the memory 51 is a mass-memory, a long testing time has been required.

In the conventional IC, as mentioned above, at the time of testing the built-in memory, the method for applying that the data are set one address by one address and confirmed the data one by one, therefore at the IC of mass built-in memory, many test patterns and long testing time are required and there are some problems such as, the limitation of performance of the testing equipment and so on.

SUMMARY OF THE INVENTION

It is therefore an object of the present invention to provide an IC that is possible to reduce the testing time regardless the capacity of the built-in memory by the simplified testing method.

Furthermore, the present invention provides an IC that is possible to implement the precise test including the error detecting by the interference among bits in the memory caused by the capacitance coupling defect between the adjacent data lines and so on, even though the test of the memory is implemented by the simplified testing method.

According to a first aspect of the present invention, the IC comprises a memory that is capable of data writing and reading, test state setting means for setting the memory in the state of test, arbitrary data setting means for setting a certain length arbitrary data to be written into the memory and batch writing means for writing in a batch process into the memory in a form of filling the memory area of the memory with the certain length arbitrary data.

According to a second aspect of the present invention, the IC comprises a memory that is capable of data writing and reading, test state setting means for setting the memory in the state of test, arbitrary data setting means for setting at least two kinds of certain length arbitrary data, to be written into the memory and batch writing means for writing in a batch process into the memory in a form of filling each divided memory area of the memory with each certain length arbitrary data.

According to a third aspect of the present invention, the arbitrary data is a length of one address length of the memory, the batch writing means write the certain length arbitrary data into each address.

According to a fourth aspect of the present invention, the arbitrary data is a length of one address of the memory, the batch writing means write arbitrary data for an even number address into an even number address of the memory and arbitrary data for an odd number address into an odd number address of the memory in batch process.

According to a fifth aspect of the present invention, the IC comprises control means for controlling the test operation of the memory controlling the batch writing and the reading in sequence the written data in a batch process and an arbitrary data storage for storing the certain length arbitrary data used for batch writing.

According to a sixth aspect of the present invention, the certain length arbitrary data used for the batch writing are outputted from the control means and stored into the arbitrary data storage.

According to a seventh aspect of the present invention, a plurality of arbitrary data are stored in the arbitrary data storage beforehand, by the indication of the control means, the certain length arbitrary data used for the batch writing are decided.

According to an eighth aspect of the present invention, as typical arbitrary data in the arbitrary data storage, the arbitrary data repeating (00), (01), (10) and (11) are stored beforehand.

According to a ninth aspect of the present invention, an input terminal inputting the arbitrary data from outside of this semiconductor integrated circuit is provided and the arbitrary data setting means have a function setting the arbitrary data inputted from the input terminal as the certain length arbitrary data used for the batch writing.

According to a tenth aspect of the present invention, a comparator for outputting a result of the comparison between the arbitrary data written in batch into the memory and the data read from the memory in sequence is provided.

The above and further objects and the novel feature of the invention will more fully appear from the following detailed description when the same is read in connection with the accompanying drawings. It is to be expressly understood, however, that the drawings are for illustration only and are not intended as a definition of the limits of the invention.

DESCRIPTION OF THE PREFERRED EMBODIMENTS

A preferred embodiment of the present invention will now be described in detail referring to the accompanying drawings.

Figure 2:
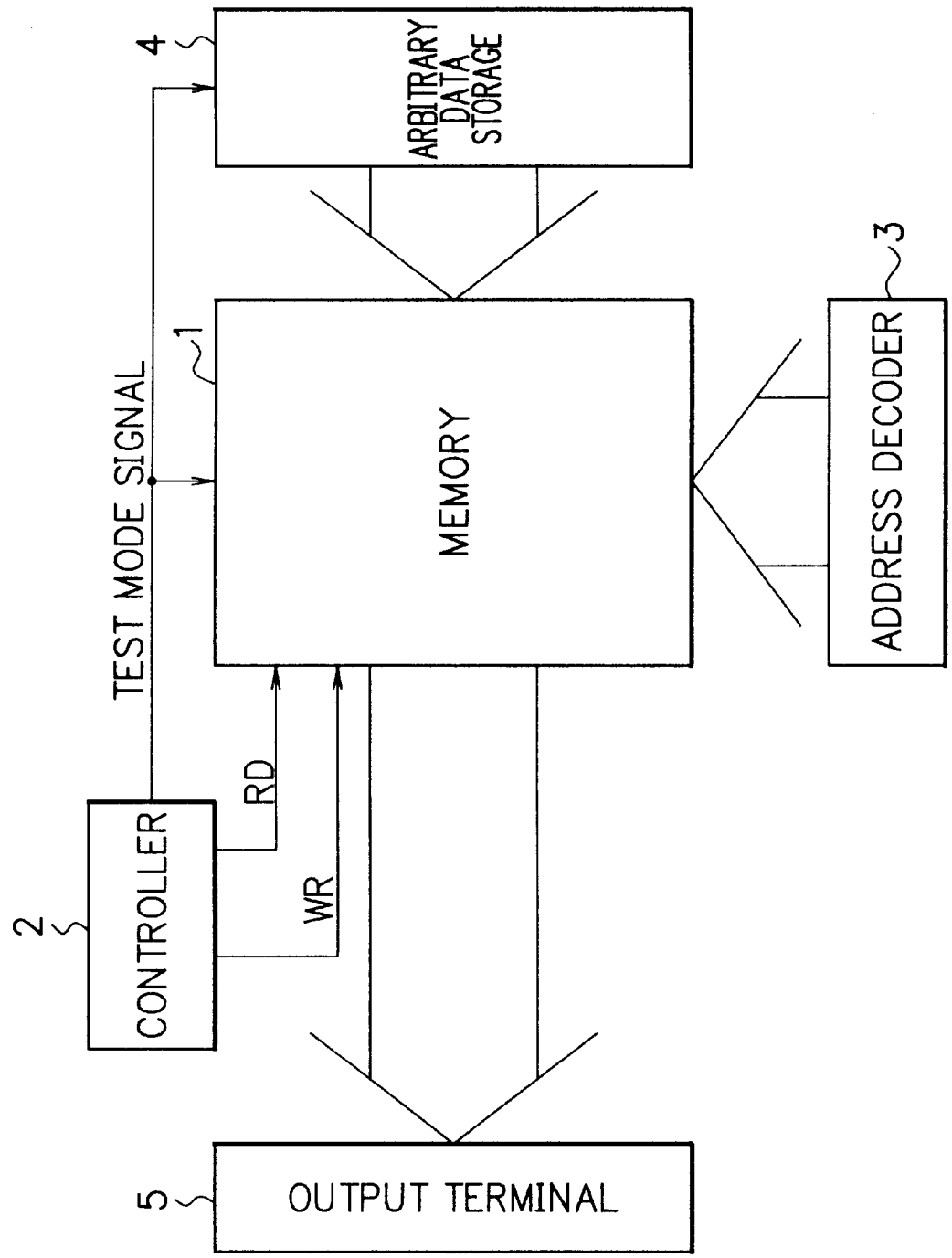
FIG. 2 is a block diagram showing an embodiment 1 of the present invention.

FIG. 2 is a block diagram showing an embodiment 1 of the present invention and shows an application for one chip micro controller. In the diagram, 1 is a built-in memory in the IC, for example, EPROM and so on, 2 is a controller controlling the test of the memory 1, such as, control means, test state setting means, arbitrary data setting means and batch writing means, 3 is an address decoder which decodes an address information indicated by the controller 2 and indicates an address for the memory 1, 4 is an arbitrary data storage for storing the arbitrary data to be written in each address of the memory 1, and 5 is an output terminal of the IC. A built-in CPU not shown in the diagram exists for controlling the total control of the IC. Above mentioned controller 2 can be set separately from CPU or inside the CPU.

The controller 2 outputs a test mode signal for setting memory test state for the memory 1 and the arbitrary data storage 4 and outputs a writing signal (WR) and a reading signal (RD). At the reading of data, an address indicating information outputs from the controller 2 to the address decoder 3 and the address of the memory 1 is indicated by the address decoder 3.

Figure 1:
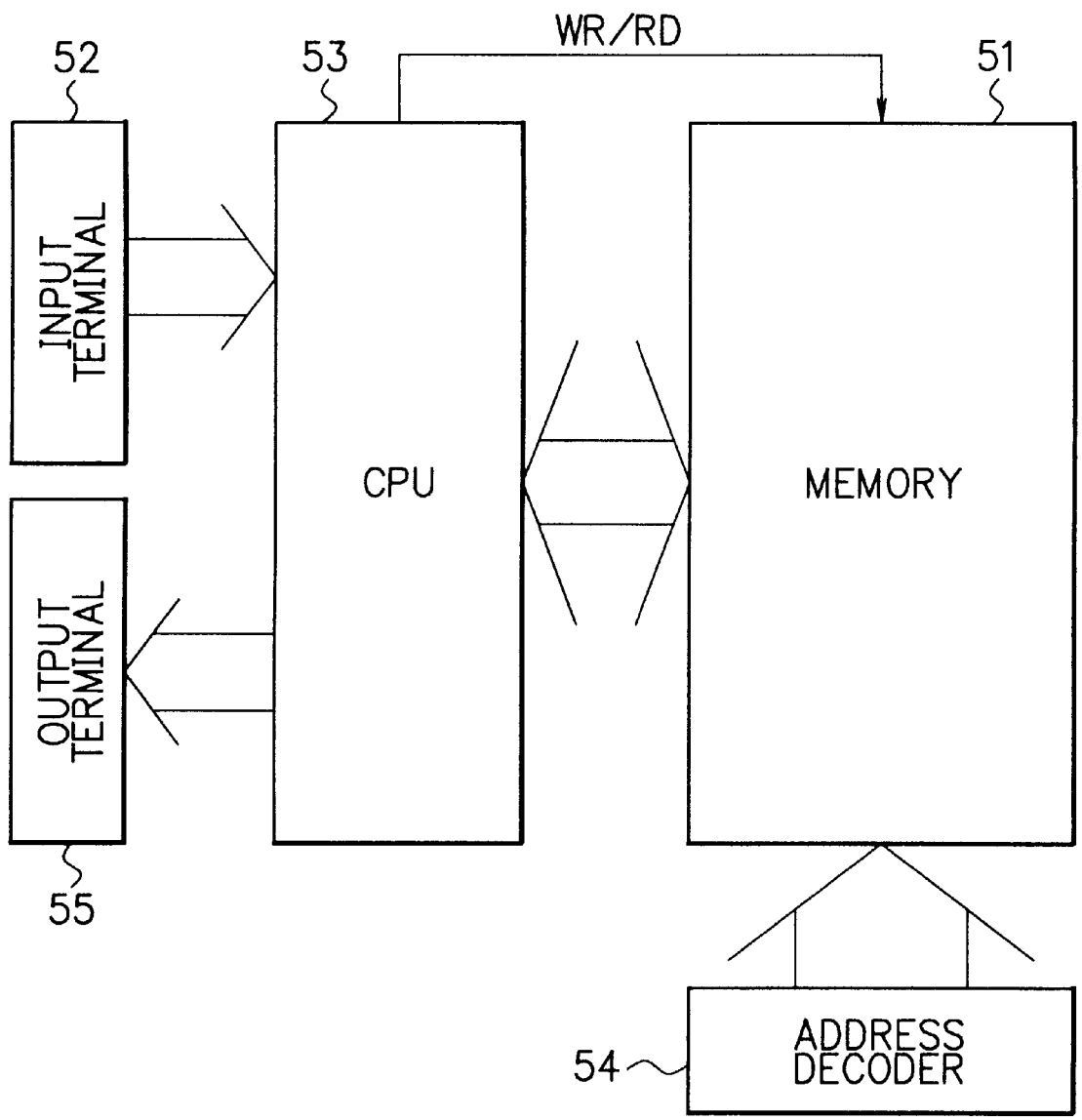
FIG. 1 is a rough diagram showing a testing method of the built-in memory in the conventional IC.

Compared with the conventional diagram FIG. 1, the embodiment 1 of the present invention FIG. 2 has no input terminal for inputting the writing data to each address. And as mentioned above, in case of the controller 2 is separated from the CPU, there is not any CPU control between the memory 1 and the output terminal 5, the test operation after transferring the test mode is controlled automatically by the control pulse.

Next, the operation of the embodiment 1 is explained. First, a rough operation at the test is explained. At the beginning of the test of the memory 1, a test mode signal from the controller 2 is outputted to a test terminal for setting the test mode and an arbitrary data storage 4. But depending on the kinds of memory 1, the test mode may be set by that one or more mode decision terminals are to be a certain value, in this case, a certain signal from the controller 2 is inputted to the mode decision terminal.

After the outputting of test mode signal, the data writing for each address of the memory 1 is implemented. At this time, the arbitrary data stored in the arbitrary data storage 4 are written into all addresses of the memory 1 all at once. The arbitrary data to be written all at once which are stored in the arbitrary data storage 4 are one byte data of eight-digit binary number, for example, in case of each address of the memory 1 is constituted in eight bits memory cell, such as, (11111111), (01010101).

The data reading from each address of the memory 1 is implemented by the same method of the conventional case. By the output of address decoder 3, the data in each address of memory 1 are read out from address 0 in sequence and outputted from the output terminal 5, and these data are compared and examined with the written data (expected data) in the external test equipment. With above operation, the data writing, storing and reading to the memory 1 are confirmed whether the operation is implemented normally or not, and the memory test is completed.

Figure 3:
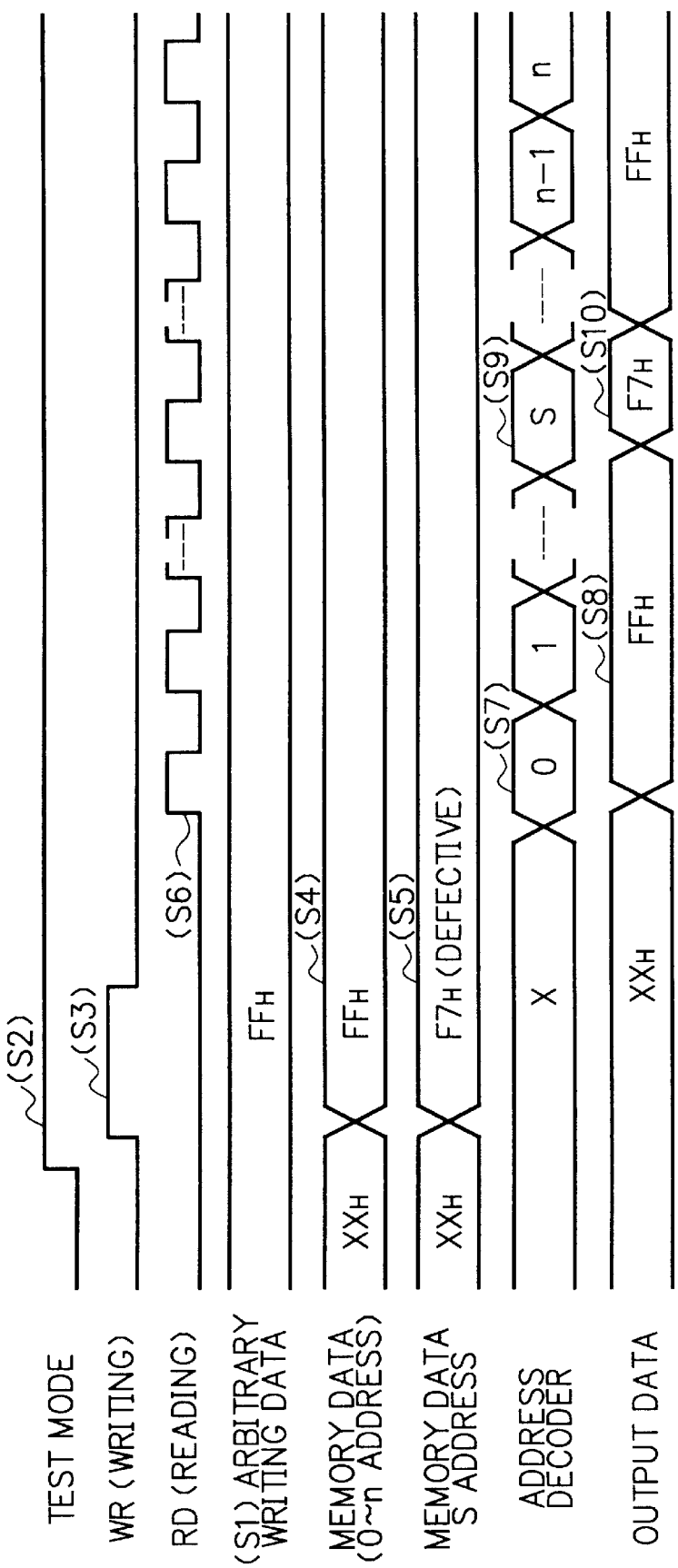
FIG. 3 is a timing chart showing the state of each section in process at the memory test in the embodiment 1.

FIG. 3 is a timing chart showing the state of each section in process of the memory test in the embodiment 1. And, the operation in the memory test is explained in detail.

First, the arbitrary data such as (01010101) to be written to each address of the memory 1 are set in the arbitrary data storage 4. This setting of the arbitrary data to the arbitrary data storage 4 can be set, for example by the controller 2 arbitrarily, or can be selected by the signal of controller 2 from a plurality of arbitrary data stored in the arbitrary data storage like ROM beforehand, for example, from the stored typical data of groups of plural bytes such as (00000000), (01010101), (10101010) and (11111111) (that is, 00H, 55H, AAH and FFH)(step S1). The case used the arbitrary data FFH is explained in the following description.

Second, a test mode signal is outputted from the controller 2, for the transition to the test mode (step S2).

Then, by the writing signal WR outputted from the controller 2, the arbitrary data stored in the arbitrary data storage 4 are written into all the addresses of the memory 1 all at once (step S3). Consequently, the contents of the address from "0" to the final address "n" of the memory 1 become FFH (step S4). And, for example in case of the defective address exists in S address, the written result of S address is such as F7H (step S5).

After writing the arbitrary data FFH in the arbitrary data storage 4 to all the addresses (0 to n), the data reading from each address of the memory 1 is implemented. The reading signal RD is outputted in sequence from the controller 2 (step S6). The address is indicated in sequence by the address decoder 3 (step S7). With these operation, from the address indicated by the address decoder 3, the data reading is implemented in sequence with the reading signal RD. And the data FFH read from each address are outputted from the output terminal 5 in sequence (step S8). The output data from the output terminal 5 are compared with the expected data FFH in the external test equipment and the memory test is completed.

As above step S5, in case of the defective address exists in S address, at the time of the address decoder 3 indicates the address S (step S9), the stored data F7H in the address S is outputted from the output terminal 5 (step S10). With this, the defect is detected by the difference from the expected data FFH in the external test equipment, the memory test is completed.

Figure 4:
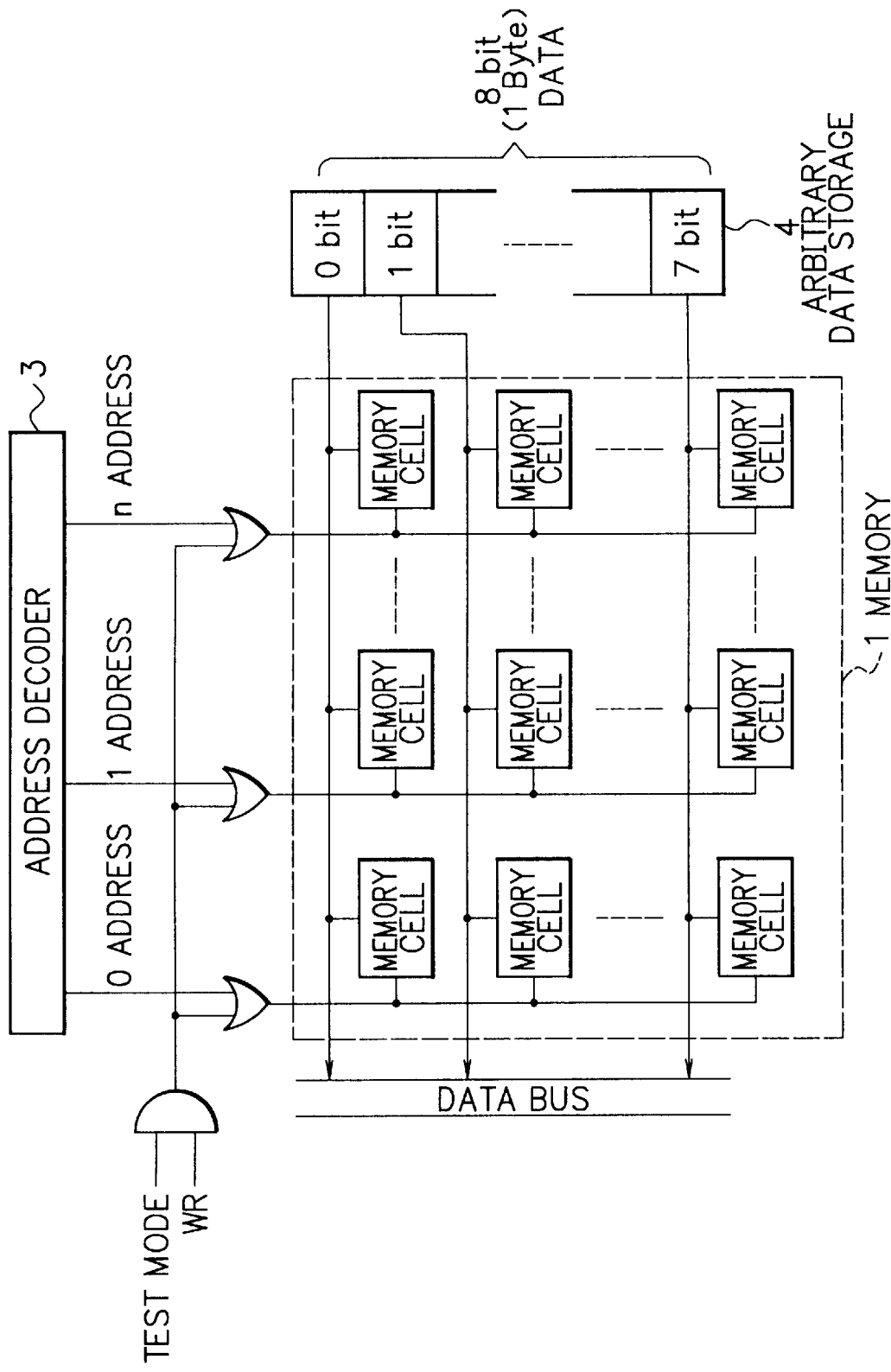
FIG. 4 is a rough operating chart of the arbitrary data writing all at once for the memory in the embodiment 1.

The writing all at once operation of the arbitrary data in the memory 1 is explained concretely with FIG. 4. In the memory 1 in FIG. 4, the memory cells of each address are disposed eight bits in vertically, in horizontally every address of "0" to "n" are disposed. The address lines are connected from the address decoder 3 via OR gate to each address and the data lines are connected from each bits of the arbitrary data storage 4 stored the arbitrary data to the data input terminal of memory cell for each bits of all the addresses. And the rest of the input terminals of OR gate is inputted the output of AND gate inputted the test mode signal and writing signal WR.

The data line connecting to each memory cell has a stored value of bit (0 or 1) corresponding to the arbitrary data storage 4, in each memory cell, at the time when the address line from the address decoder 3 becomes High, the possessed data of the data line is written.

At the time of the arbitrary data writing for the memory 1 all at once, the state inputting both the test mode signal and the writing signal WR into AND gate happens, therefore the output of AND gate becomes High, as a result, the outputs of each OR gate become all High. And the stored data in the bits corresponding to the arbitrary data storage 4 are written into all the cells of the memory 1, the arbitrary data writing all at once for all the cells of the memory 1 is completed.

As mentioned above, by the embodiment 1 of the present invention, at the time of testing the built-in memory in the IC, the writing of the arbitrary data to the every address of the memory 1 all at once is possible, therefore even in case of the memory 1 is mass memory, the writing can be implemented all at once, it is possible to reduce the testing time, furthermore, the many testing patterns needed at the conventional IC are not necessary any more.

The data writing into all the addresses of the memory 1 are not limited to the specific data like as 00H(00000000) and FFH(11111111) and can be set the data arbitrarily, for example, by writing different data to the memory cells of each address intentionally by turns, such as 55H(01010101) and AAH(10101010), it is possible to detect such as a capacitance coupling defect between the adjacent data lines, even though the test of the memory 1 is implemented in a simplified method, the precise test can be performed including the detection of error occurred by the interference among bits in the memory 1.

In the above description, using eight bits (one byte) arbitrary data of one address length as an arbitrary data, the arbitrary data are written in each address and the writing all at once method is applied, but corresponding to the actual memory cell disposition and wiring of the memory 1, for example, using a few addresses length arbitrary data as an arbitrary data, it is needless to say adopting the method that is capable of writing the arbitrary data in a few addresses length.

Figure 5:
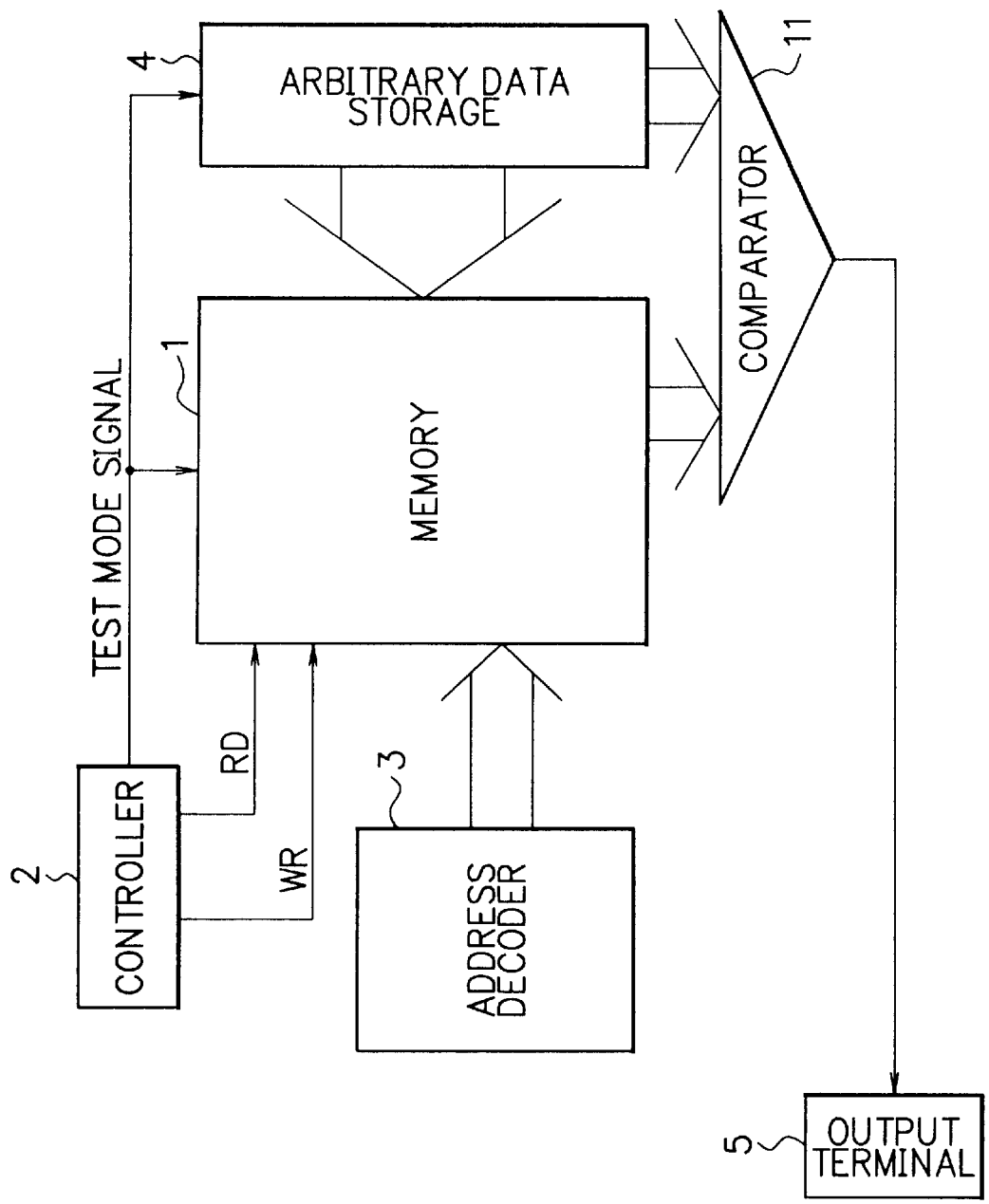
FIG. 5 is a block diagram showing an embodiment 2.

Now, an embodiment 2 is explained. FIG. 5 is a block diagram of the embodiment 2 of the present invention, 11 is a comparator. The same sections in the embodiment 1 of FIG. 2 are put the same section number and the repeated explanation is omitted. The comparator 11 compares the arbitrary data stored in the arbitrary data storage 4 with the read data from each address of the memory 1 in sequence directed by the address decoder 3 and outputs the result of the comparison.

Next, an operation of the embodiment 2 is explained. In the embodiment 2, at the test mode the stored arbitrary data in the arbitrary data storage 4 are written in all the addresses of the memory 1 all at once and the stored data in 0 address to n address of the memory 1 are read in sequence by the output of the address decoder 3 is the same as the operation of the embodiment 1, therefore the repeated explanation is omitted.

The data in each address of the memory 1 which are read by the output of the address decoder 3 are compared with the arbitrary data stored in the arbitrary data storage 4, the compared results are outputted from the output terminal 5 by the comparator 11. This outputted data are monitored by the external equipment and confirmed whether the data reading, storing and writing to the memory 1 are in normal or not, with above operation, the memory test for the memory 1 is completed.

Figure 6:
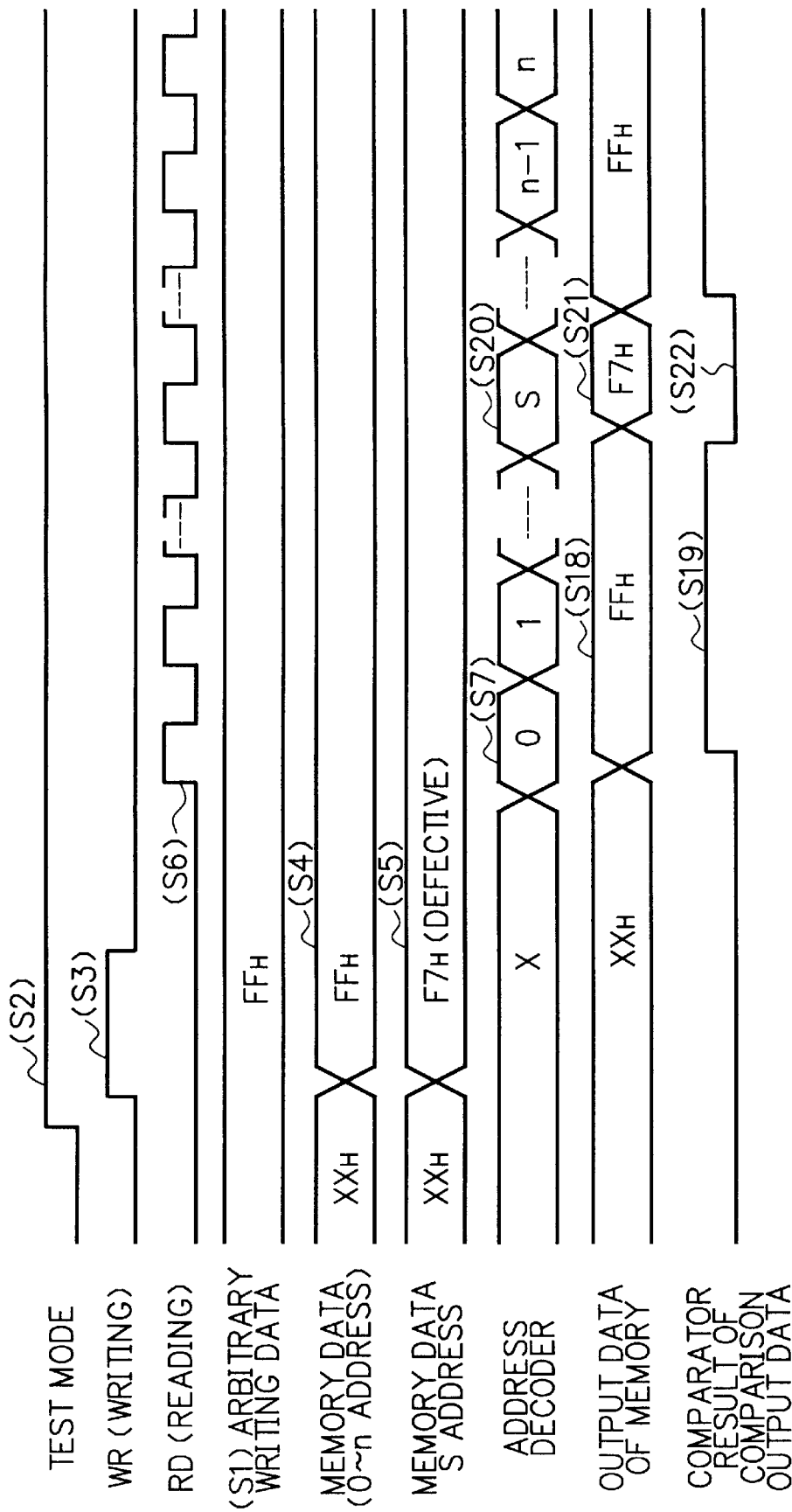
FIG. 6 is a timing chart showing the state of each section in process at the memory test in the embodiment 2.

FIG. 6 is a timing chart showing the state of each section in process of the memory test of the embodiment 2 of the present invention. Next, the operation at the memory test is explained in detail. The step S1 to S7 are the same operation as in the embodiment 1. The step S1 to S7 are the operation from the stored arbitrary data in the arbitrary data storage 4 are written in all the addresses of the memory 1 all at once to the stored data in the address 0 to n in the memory 1 are read in sequence by the output of the address decoder 3, therefore the repeated explanation is omitted.

From the address of the memory 1 indicated the address by the address decoder 3, the data are read by the reading signal RD, the read data FFH is inputted to one input terminal of the comparator 11 (step S18).

In the other input terminal of the comparator 11, the stored data FFH as the standard data in the arbitrary data storage 4 is inputted, the compared result of the data is outputted by the comparator 11, from the output terminal 5 as the output data the data (for example High) is outputted (step S19). The output data from the output terminal 5 are monitored at the external test equipment and the memory test is completed.

As shown in the step S5, in case of S address is a defective address and the data F7H is stored, at the time the address decoder 3 appoints the address S (step S20), the stored data F7H in the S address are inputted to the comparator 11 (step S21), the compared result of the comparator 11 is outputted as the output data (for example Low) from the output terminal 5 (step S22). With these operation, the external test equipment monitors detecting the defect, the memory test for the memory 1 is completed.

According to the embodiment 2, in addition to the effect of the embodiment 1, by providing the comparator 11, for the external test equipment the compared result is possible to be outputted directly, by the simple monitoring of the external test equipment, the result of the memory test for the memory 1 is possible to be judged. Furthermore, the function of the comparator 11 is not limited to the above mentioned matter, it is possible to constitute the function outputting, for example such as the address detecting defect and the data.

Figure 7:
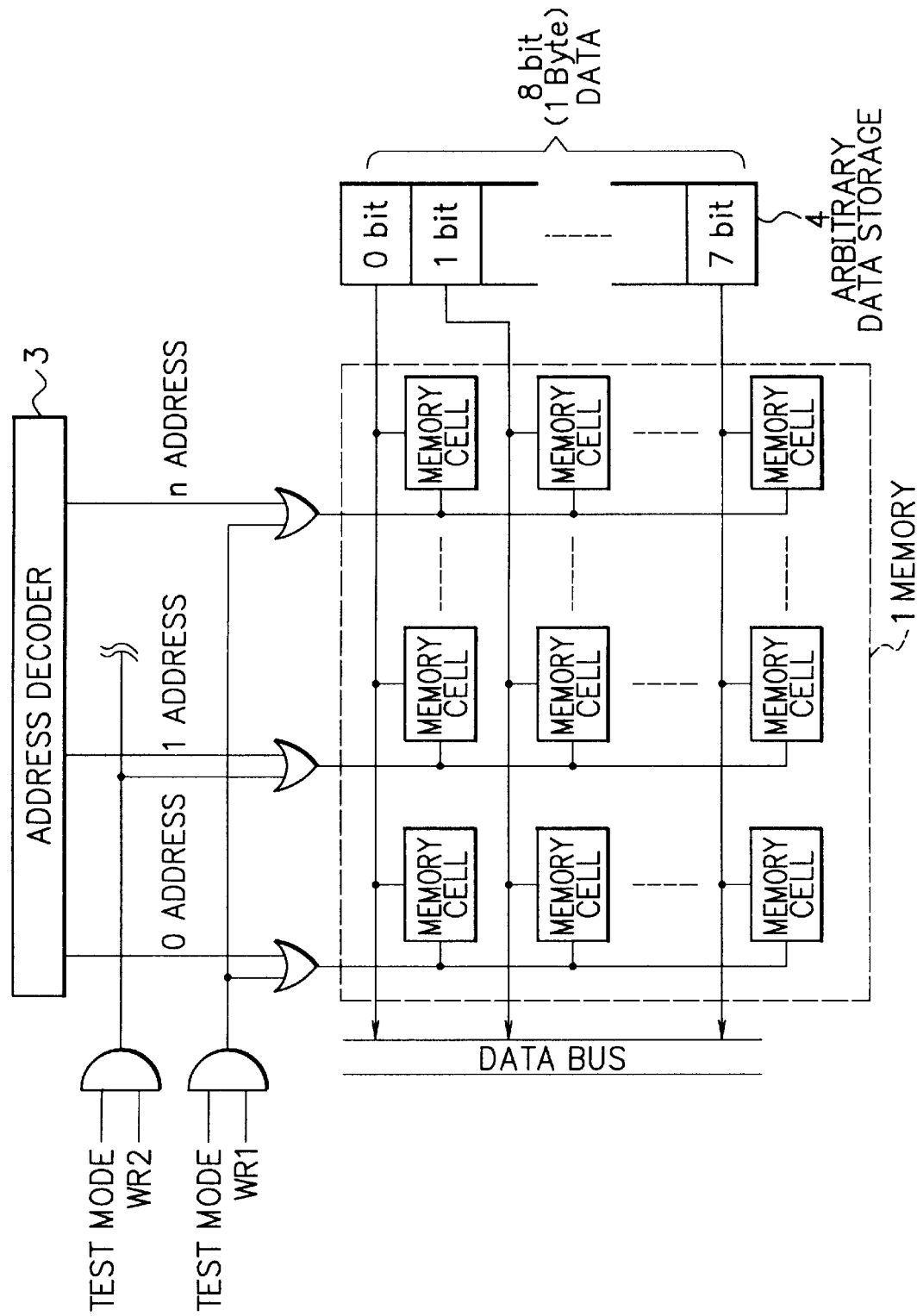
FIG. 7 is a rough operating chart of the arbitrary data writing all at once for the memory in an embodiment 3.

An embodiment 3 is explained. FIG. 7 is a rough diagram showing an operation writing the arbitrary data all at once for the memory 1 of the embodiment 3 of the present invention. The embodiment 3 applies a different writing method all at once for the arbitrary data of the memory 1 from the embodiments 1 and 2. Therefore the repeated explanation for the constitution and the common operation is omitted.

In FIG. 7, the address lines are connected to each address of the memory 1 via OR gate from the address decoder 3 is the same as the embodiments 1 and 2 in FIG. 4, but the OR gate of this embodiment 3 provides two systems that one is for even number address and the other is for odd number address, one input terminal of each OR gate for the even number address is inputted the output of AND gate for the even number address, one input terminal of each OR gate for the odd number address is inputted the output of AND gate for the odd number address, this is different from the case of FIG. 4. Each AND gate for the even number address and the odd number address is inputted the test mode signal said the writing signal WR as the same as the case of FIG. 4.

Next, the operation at the writing of the arbitrary data all at once for the memory 1 of the embodiment 3 is explained.

The data lines connecting to each memory cell have a stored value in bits (0 or 1) corresponding to the arbitrary data storage 4, in each memory cell, at the time when the address lines from the address decoder 3 become High, the values having the data lines at the time are written. This is the same as the embodiments 1 and 2.

In the writing of the arbitrary data all at once for the memory 1 in this embodiment 3, at first the writing of the arbitrary data for the even number address to the even number address all at once is implemented, second the writing of the arbitrary data for the odd number address to the odd number address all at once is implemented. There is no meaning to start from the even number address, it is possible to start from the odd number address.

First, the arbitrary data for the even number address like as (01010101) to be written into the even number address of the memory 1 are set in the arbitrary data storage 4 beforehand. As this setting of the arbitrary data for the even number address to the arbitrary data storage 4 is explained in the embodiment 1, for example it can be implemented by the controller 2 arbitrarily, further in the arbitrary data storage 4 a plurality of arbitrary data like ROM, for example, typical plural bites data of group such as (00000000), (01010101), (10101010) and (11111111) (i.e. 00H, 55H, AAH and FFH) are stored beforehand and it can be possible to select as the arbitrary data for the even number address from one of this group by the signal of the controller 2.

And, to transfer to the test mode, after outputting the test mode signal from the controller 2, the writing of the arbitrary data for the even number addresses to the even number addresses of the memory 1 is implemented all at once. At this time, by the writing signal WR1 for the even number address outputting from the controller 2, both the test mode signal and the writing signal WR1 are inputted to the AND gate for the even number address, the output of AND gate for the even number address becomes High, consequently, the all output of each OR gate for the even number addresses become High. As the result, for all the memory cells of the even number addresses of the memory 1, the data for the even number addresses stored in the corresponding bits in the arbitrary data storage 4 are written and the writing of the arbitrary data for the even number addresses corresponding to the even number addresses of the memory 1 is completed all at once.

Next, in the arbitrary data storage 4, the arbitrary data for the odd number addresses like (10101010) to be written into the odd number addresses of the memory 1 are set.

After that, the writing of the arbitrary data for the odd number addresses to the odd number addresses of the memory 1 is implemented all at once. At this time, by the writing signal WR2 for the odd number address outputting from the controller 2, both the test mode signal and the writing signal WR2 are inputted to the AND gate for the odd number addresses, the output of AND gate for the odd number addresses becomes High, consequently, the all output of each OR gate for the odd number addresses become High. As the result, for all the memory cells of the odd number addresses of the memory 1, the data for the odd number addresses stored in the corresponding bits in the arbitrary data storage 4 are written and the writing of the arbitrary data for the odd number addresses corresponding to the odd number addresses of the memory 1 is completed all at once.

With the above operation, the writing of the arbitrary data to both the even number addresses and the odd number addresses of the memory 1 all at once is completed separately. The operation such as the reading is possible to be implemented by the same way as the embodiment 1 and 2.

According to the embodiment 3, the writing of the different arbitrary data to the even number addresses and the odd number addresses is possible to be written all at once, therefore, in addition to the effect mentioned in the embodiments 1 and 2, it is possible to write, for example (01010101) to an even number address, (10101010) to an odd number address all at once, and (00000000) to an even number address, (11111111) to an odd number address all at once, it becomes possible to implement the precise test including the detection of error interfered between memory cells of the same bits being adjacent to the direction of the address.

Figure 8:
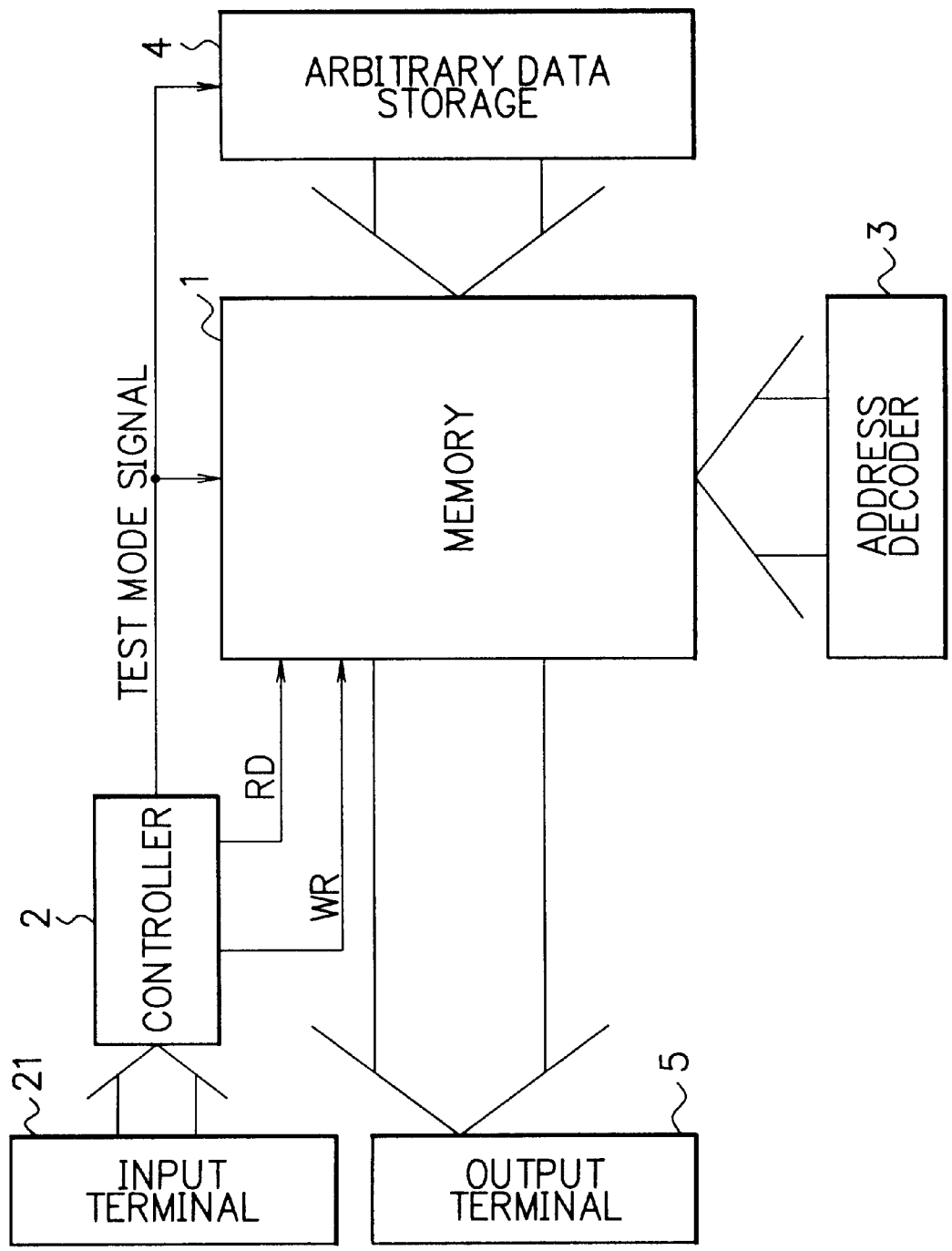
FIG. 8 is a block diagram showing an embodiment 4 of the present invention.

Next, an embodiment 4 is explained. FIG. 8 is a block diagram showing the embodiment 4 of the present invention and 21 is an input terminal. The same sections of the embodiment 1 shown in FIG. 2 are put the same signs and the repeated explanation is omitted.

The operation of the embodiment 4 is explained. At the setting of the arbitrary data to the arbitrary data storage 4, corresponding to the necessity of the test, the arbitrary data to be stored to the arbitrary data storage 4 are inputted from the external equipment via an input terminal 21. The operation except the setting of the arbitrary data to the arbitrary data storage 4 is the same as the embodiment 1.

As mentioned above, in the embodiment 4, the arbitrary data to be stored to the arbitrary data storage 4 is possible to be inputted from the external equipment via the input terminal 21, therefore, corresponding to the necessity of the test of the memory 1, it is possible to implement the memory test changing the arbitrary data written into the memory 1 all at once from the external equipment. The above mentioned setting of the arbitrarily data to the arbitrary data storage 4 via the input terminal 21 is applicable to the embodiment 2 and 3 too.

According to a first aspect of the present invention, the IC comprising: a memory that is capable of data writing and reading; test state setting means for setting the memory in the state of test; arbitrary data setting means for setting a certain length arbitrary data to be written into the memory; and batch writing means for writing in a batch process into the memory in a form of filling the memory area of the memory with the certain length of the arbitrary data. Therefore, at the time of testing the built-in memory, it is possible to write all at once the arbitrary data to the all area of the memory, even in case of mass memory, it is possible to reduce the test time by writing all at once and many test patterns are not necessary. Further the arbitrary data are not limited to such as (00 . . . ) and can be set the data arbitrarily, therefore for example, writing intentionally the value of memory cells of each address differently by turns, it is possible to detect such as the capacitance coupling defect between adjacent data lines, though implementing the memory test by the simplified method, it is possible to implement a precise test including the error detection by the interference between bits in the memory.

According to a second aspect of the present invention, the IC comprising: a memory that is capable of data writing and reading; test state setting means for setting the memory in the state of test; arbitrary data setting means for setting at least two kinds of certain length arbitrary data to be written into the memory; and batch writing means for writing in a batch process into the memory in a form of filling each divided memory area of the memory with each certain length the arbitrary data, therefore at the test of the built-in memory, it is possible to write all at once each arbitrary data to each divided memory area of the memory, even in case of the mass memory, it is possible to reduce the test time by several times of writing all at once. And the arbitrary data are not limited to such as (00 . . . ) and can be set the data arbitrarily, therefore for example, writing intentionally the value of memory cells of each address differently by turns, it is possible to detect such as the capacitance coupling defect between adjacent data lines, though implementing the memory test by the simplified method, it is possible to implement a precise test including the error detection by the interference between bits in the memory. Moreover, for each divided area of the memory, different arbitrary data are possible to be written, more precise test is possible to be implemented.

According to a third aspect of the present invention, the arbitrary data is a length of one address length in the memory area, the batch writing means write the certain length arbitrary data into each address, therefore the batch writing means make all at once writing possible easily by controlling the address lines.

According to a fourth aspect of the present invention, the arbitrary data is a length of one address in the memory area, the batch writing means implement the batch writing of arbitrary data for even number address in the even number address of the memory and the batch writing of arbitrary data for odd number address in the odd number address of the memory, therefore, the batch writing of different arbitrary data to an even number address and an odd number address is possible, and for example by writing the different value in the address adjacent memory cells intentionally by turns, the error detection makes possible by the interference between memory cells that are adjacent in the direction of address and have the same bits, further it is possible to implement more precise test.

According to a fifth aspect of the present invention, the IC provides control means for controlling the test operation of the memory controlling the batch writing and the reading in sequence the written data in a batch process and an arbitrary data storage for storing the certain length arbitrary data used for the batch writing, therefore it is possible to implement the test of the memory in a short time and automatically by the test operation control of the control means and the batch writing of the arbitrary data in the arbitrary data storage.

According to a sixth aspect of the present invention, the certain length arbitrary data used for the batch writing are outputted from the control means and stored into the arbitrary data storage, therefore it is possible to implement the test of the memory by the writing in batch process used the arbitrary data decided by the control means.

According to a seventh aspect of the present invention, a plurality of arbitrary data are stored in the arbitrary data storage beforehand, by the indication of the control mean s, the certain length arbitrary data used for the batch writing are decided.

According to an eighth aspect of the present invention, as typical arbitrary data in the arbitrary data storage, the arbitrary data repeating (00), (01), (10) and (11) are stored beforehand, therefore it is possible to implement the precise test including the error detection with the interference between bits in the memory by storing a small number of arbitrary data in the arbitrary data storage.

According to a ninth aspect of the present invention, the IC provides an input terminal inputting the arbitrary data from outside of the IC and the arbitrary data setting means have a function setting the arbitrary data inputted from the input terminal as the certain length arbitrary data used for the batch writing, therefore corresponding to the necessity of the memory test, it is possible to implement the test changing the arbitrary data to be written into memory in batch from outside.

According to a tenth aspect of the present invention, the IC provides a comparator for outputting a result of the comparison between the arbitrary data written in batch into the memory and the data read from the memory in sequence, therefore it is possible to output directly the result of the comparison to the external equipment and to judge the result of the memory test for the memory by a simple monitor in the external equipment.

While preferred embodiments of the invention have been described using specific terms, such description is for illustrative purposes only, and it is to be understood that changes and variations may be made without departing from the spirit or the scope of the following claims.

What is claimed is:

1. A semiconductor integrated circuit, comprising:
   a memory that is capable of data writing and reading;
   test state setting means for setting said memory in a test state;
   arbitrary data setting means for setting a predetermined length of arbitrary data to be written into said memory; and
   batch writing means for writing in a batch process said arbitrary data into said memory to simultaneously fill a memory area of said memory with said arbitrary data.

2. A semiconductor integrated circuit in accordance with claim 1, wherein said arbitrary data is a length of one address of said memory, and said batch writing means write said arbitrary data into each address.

3. A semiconductor integrated circuit in accordance with claim 2, further comprising:
   control means for controlling the test operation of said memory and controlling in sequence the batch writing and reading of the written data in said batch process; and
   an arbitrary data storage for storing said arbitrary data used for said batch writing.

4. A semiconductor integrated circuit in accordance with claim 1, further comprising:
   control means for controlling the test operation of said memory and controlling in sequence the batch writing and reading of the written data in said batch process; and
   an arbitrary data storage for storing said arbitrary data used for said batch writing.

5. A semiconductor integrated circuit in accordance with claim 4, wherein said arbitrary data used for said batch writing is outputted from said control means and stored into said arbitrary data storage.

6. A semiconductor integrated circuit in accordance with claim 4, wherein a plurality of arbitrary data is initially stored in said arbitrary data storage, by the indication of said control means, said arbitrary data used for said batch writing is determined.

7. A semiconductor integrated circuit in accordance with claim 4, wherein a comparator outputs a result of a comparison between said arbitrary data written in said memory and data read from said memory in sequence.

8. A semiconductor integrated circuit in accordance with claim 1, wherein an input terminal inputs said arbitrary data from outside of said semiconductor integrated circuit, and said arbitrary data setting means sets said arbitrary data inputted from said input terminal as said arbitrary data used for a batch writing.

9. A semiconductor integrated circuit in accordance with claim 1, wherein said length of said arbitrary data is one byte data.

10. A semiconductor integrated circuit in accordance with claim 1, wherein said data written in said memory is outputted and compared with expected data in external test equipment.

11. A semiconductor integrated circuit, comprising:

a memory that is capable of data writing and reading;

test state setting means for setting said memory in a test state;

arbitrary data setting means for setting at least two predetermined lengths of arbitrary data to be written into said memory; and batch writing means for writing in a batch process said arbitrary data into said memory to simultaneously fill a divided memory area of said memory with said arbitrary data.

12. A semiconductor integrated circuit in accordance with claim 11, wherein said arbitrary data is a length of one address of said memory, and said batch writing means write said arbitrary data into each address.

13. A semiconductor integrated circuit in accordance with claim 12, further comprising:

control means for controlling the test operation of said memory and controlling in sequence the batch writing and reading of the written data in said batch process; and an arbitrary data storage for storing said arbitrary data used for said batch writing.

14. A semiconductor integrated circuit in accordance with claim 11, wherein said arbitrary data is a length of one address of said memory, and said batch writing means write said arbitrary data for an even number address into an even number address of said memory and for an odd number address into an odd number address of said memory in said batch process.

15. A semiconductor integrated circuit in accordance with claim 11, further comprising:

control means for controlling the test operation of said memory and controlling in sequence the batch writing and reading of the written data in said batch process; and an arbitrary data storage for storing said arbitrary data used for said batch writing.

16. A semiconductor integrated circuit in accordance with claim 15, wherein arbitrary data in said arbitrary data storage is repeating (00), (01), (10) and (11) and is stored beforehand.

17. A semiconductor integrated circuit in accordance with claim 15, wherein said arbitrary data used for said batch writing is outputted from said control means and stored into said arbitrary data storage.

18. A semiconductor integrated circuit in accordance with claim 15, wherein a plurality of arbitrary data is initially stored in said arbitrary data storage, by the indication of said control means, said arbitrary data used for said batch writing is determined.

19. A semiconductor integrated circuit in accordance with claim 11, wherein said length of said arbitrary data is one byte data.

20. A semiconductor integrated circuit in accordance with claim 11, wherein said data written in said memory is outputted and compared with expected data in external test equipment.

* * * * *